United States Patent [19]

Dötzer et al.

[11] Patent Number: 4,495,378

[45] Date of Patent: Jan. 22, 1985

[54] HEAT-REMOVING CIRCUIT BOARDS

[75] Inventors: Richard Dötzer, Nuremberg; Ernst-Friedrich Lechner, Erlangen, both of Fed. Rep. of Germany

[73] Assignee: Siemens Aktiengesellschaft, Munich, Fed. Rep. of Germany

[21] Appl. No.: 525,378

[22] Filed: Aug. 22, 1983

Related U.S. Application Data

[63] Continuation of Ser. No. 303,102, Sep. 17, 1981, abandoned.

[30] Foreign Application Priority Data

Sep. 22, 1980 [DE] Fed. Rep. of Germany ....... 3035749

[51] Int. Cl.³ .............................................. H05K 1/05
[52] U.S. Cl. .................................. 174/68.5; 361/386; 361/387
[58] Field of Search ................. 174/68.5; 361/386, 387

[56] References Cited

U.S. PATENT DOCUMENTS

| | | | |
|---|---|---|---|
| Re. 29,784 | 9/1978 | Chadwick | 174/68.5 |
| 2,923,860 | 2/1960 | Miller | 174/68.5 |
| 3,165,672 | 1/1965 | Gellert | 361/387 |
| 3,213,184 | 10/1965 | Bondley | 174/50.63 X |
| 3,296,099 | 1/1967 | Dinella | 174/68.5 X |
| 4,130,855 | 12/1978 | Smolko | 361/387 X |
| 4,141,029 | 2/1979 | Dromsky | 174/52 FP X |

FOREIGN PATENT DOCUMENTS

| | | |
|---|---|---|
| 1105068 | 3/1968 | United Kingdom . |
| 1365009 | 8/1974 | United Kingdom . |

OTHER PUBLICATIONS

Laland Teschler, New Circuit Boards Beat Heat and Vibration, Machine Design, V. 51 #2, Jan. 1979, pp. 105 to 109.

Primary Examiner—R. R. Kucia
Attorney, Agent, or Firm—Kenyon & Kenyon

[57] ABSTRACT

The invention relates to circuit boards consisting of a flat core plate, 1 to 5 mm thick, of metallic material, graphite or electrically conductive carbon with a coating, 10 to 80 μm thick, of electroplated aluminum eloxal and, optionally, an intermediate layer of copper or silver, 0.1 to 2 μm thick. On the electroplated Al eloxal layer, a conductor run structure generated by an additive or subtractive technique may be present. The highly heat-conducting and mechanically strong circuit boards find application in electronics.

6 Claims, 2 Drawing Figures

HEAT-REMOVING CIRCUIT BOARDS

CROSS-REFERENCE TO A RELATED APPLICATION

This application is a continuation of U.S. patent application Ser. No. 303,102, filed Sept. 17, 1981 and now abandoned.

BACKGROUND OF THE INVENTION

The present invention relates to heat-removing circuit boards having a core of metallic materials and an electrically insulating coating.

Fiberglass-reinforced epoxy-resin circuit boards provided for semiconductor technology and electronics, as well as circuit boards of highly heat-conductive metals with insulating varnish or plastic layers or aluminum-oxide ceramic circuit boards, frequently can no longer meet the specified requirements in use, particularly with respect to mechanical strength, heat removal or flammability.

Cooling or heat removal are possible only inadequately and expensively by superficial forced air cooling of the electronic modules on fiberglass-reinforced epoxy-resin circuit boards by means of air blowers with flow velocities, which widely differ locally, of maximally, at first 3 m/sec and later, even 6 m/sec. Also water-cooled flat assemblies for removing the Joule heat (dissipation losses) in order to keep the components (which may give off as much as 2 W) below 70° C., are not satisfactory with respect to reliability and operating safety, because an even brief and local failure of the cooling system can lead to irreversible damage to the operability of the electronic system or even to the failure of the overall installation.

While the relatively expensive aluminum-oxide ceramic plates are usable up to circuit board formats of about 25×50 mm as conductor run substrates, their use is very limited for larger formats, especially in view of the insufficient mechanical strength (brittleness) and lack of flatness. The use of larger circuit boards of aluminum oxide ceramic is usually prevented by the costs.

Tests with plates, with and without holes, of highly heat-conductive metals with insulating varnish or plastic layers also have shown numerous shortcomings. Thus, the varnish layers are too thin at the edges of the holes, small holes are clogged up with varnish or plastic, and, when plastic powder layers are sprinkled-on, the layers become too thick and droop at the holes in funnel-fashion instead of at right angles. Because of the particularly low heat conductivity of insulating varnishes and plastics, thicker layers have an especially deterimental effect on local heat removal processes. To all this must, finally, be added the large problems of adhesion of the conductor run metal layers on varnish or plastic surfaces.

SUMMARY OF THE INVNENTION

It is therefore an object of the present invention to provide circuit boards which do not have the above-mentioned disadvantages and, while providing good heat removal from the components, ensure lower operating temperatures thereof and thus, higher operating reliability, have greater mechanical strength and better flatness, are non-flammable and also allow secure grounding and shielding, and have good electromagnetic compatibility. The circuit boards should, furthermore, allow easier mechanical fabrication, combined with better corrosion protection of the surface coating.

This problem is now solved by the provision of heat-removing circuit boards which are characterized by the feature that a flat core plate 1 to 5 mm thick has an electrodeposited aluminum eloxal layer of a thickness of 10 to 80 $\mu$m, optionally with a conducting intermediate layer between the core plate and the electrodeposited aluminum eloxal layer. On this electrodeposited layer, the conductor runs or tracks can be built-up by an additive or subtractive technique as well as by thin-film insulating or adhesive film and by thick-film techniques.

The circuit boards according to the present invention are highly heat-conducting and thereby allow rapid removal of the Joule heat of the electronic modules produced by the dissipation losses. Due to the rapid heat removal, the electrical and electronic components, which find use in semiconductor technology and in industrial electronics, operate at lower operating temperatures. This feature increases not only their operating reliability, but also their service life. By means of the electrically conducting core, the circuit boards also make possible secure grounding and shielding, which leads, utilizing the nonmagnetic behavior of the electrodeposited aluminum eloxal coating, to a very good electromagnetic compatibility (EMV characteristics). The circuit boards have higher mechanical strength combined with better flatness, and also permit larger circuit board formats such as 340×360 mm, such as are required primarily in measuring and control engineering. Highly advantageous are furthermore the special surface properties of electrodeposited aluminum eloxal, such as electric insulation, an excellent adhesion base for insulating varnishes and adhesives as well as metallic and nonmetallic coatings, dyeability in any color and printability, great surface hardness and wear resistance, high heat conductivity as well as excellent corrosion protection behavior against atmospheric influences. The circuit boards according to the present invention are furthermore noncombustible.

Simpler fabrication and easier mechanical machinability with less wear of the drilling tools also are features of the circuit boards according to the present invention, as well as better dimensional stability and freedom from aging phenomena.

The core of the highly heat-removing circuit boards according to the present invention, preferably 1 to 2 mm thick, may consist of highly heat-conducting, mechanically strong metals such as copper, aluminum, iron, titanium or other metal materials as well as, in special cases, of silver or also of thermally and electrically conductive graphite or carbon.

DESCRIPTION OF THE FIGURES

The invention is illustrated by the drawing. It shows, in cross section, heat-removing circuit boards 1 and 6 according to the present invention.

Figure 1:
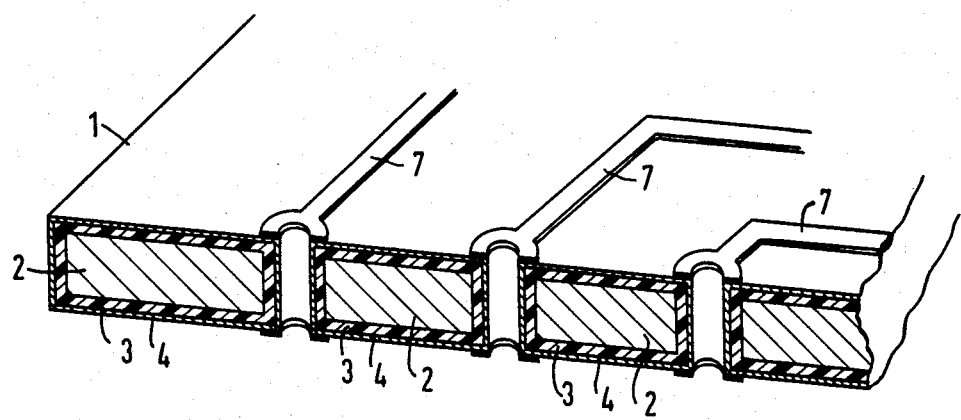
FIG. 1 shows an iron core 2 of a perforated circuit board 1, which is coated with an electrodeposited aluminum eloxal layer 3, 50 $\mu$m thick, and a polyimide layer 4, 5 $\mu$m thick.
Figure 2:
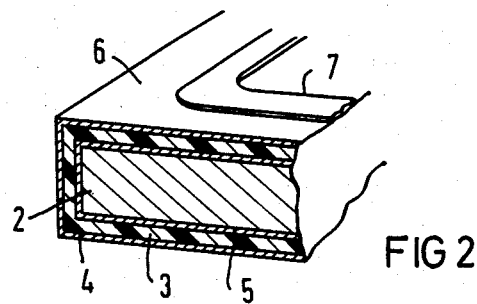

According to FIG. 2, the core is coated with an intermediate copper layer 5, 0.5 $\mu$m thick, on which the electrodeposited aluminum eloxal layer 3 and the insulating varnish layer 4 are applied. The conductor run structure is designated with 7.

DETAILED DESCRIPTION OF THE INVENTION

The heat-removing circuit boards according to the present invention are made from core plates ground flat and provided with holes of, for example, 0.8 to 1.2 mm diameter, 1 to 5 mm thick, with a surface quality grade 04 and 05 (ready for electroplating as per DIN), secured in a titanium frame with point contacts or suspended by tenterhooks and provided with contacts, and is then surfaced-treated and provided with an electrodeposited aluminum coating according to British Pat. No. 1 365 009 and U.S. Pat. Nos. 3,418,216; 3,972,784; 4,053,383; 4,176,034; 4,032,413; 4,071,526 and 4,144,140.

It is a particular advantage of the electrodeposited aluminum coating that, due to the high throwing power of aprotic aluminum baths, a largely uniform coating on the surfaces as well as in the drill hole walls is obtained. This is an essential prerequisite for the subsequent anodizing of the applied, electrodeposited aluminum to form the insulating electrodeposited aluminum eloxal.

For anodizing, eloxating baths known per se can be used, such as GS-, GSX-, GX- or hard eloxating baths. In this manner, an electrically insulating and at the same time highly heat-conducting coating of the core circuit boards are obtained which are distinguished by exceptionally great hardness (4000 N/mm$^2$ HV) and corresponding wear resistance as well as by high resistance to atmospheric influences. The electrodeposited aluminum eloxal layer so produced is densified either in boiling deionized or distilled water or in super-heated steam in 30 to 60 minutes and thereby made especially corrosion resistant, or coated with a thin film of insulating varnish.

Prior to the densification, the transparent, glass-clear electrodeposited Al-eloxal layer can be marked by dyeing, owing to its special fine-structure, in any desired manner or lettered with sharp contours by printing, and thereby characterized, also in several colors. Its insulating resistance can also be increased by incorporating nonconductive, insulating substances, for example, silica, $Cr_2O_3$, $TiO_2$, $Al_2O_3$, etc.

The heat-removing circuit boards according to the present invention can be used to advantage in units with a high packing density of the components. They are particularly suited for the applications in industrial electronics where it is necessary to combine control and power components on one board unit.

The invention is explained in greater detail by the following Examples:

EXAMPLE 1

(A) Preparation Of The Electrodeposited Aluminum Eloxal Coating

A plate 2 mm thick of iron (USt 1203) with holes of 1.2 mm diameter is secured by four titanium needle contacts via the narrow side edges in the titanium frame (article rack) and at the same time provided with contacts. The dimensions of the board are 340×360 mm.

For surface treatment, the plate together with the frame is pickled in an acid etching bath (TRINORM "Fe"(TM), Schering Ag, Berlin), rinsed in flowing water and coated in a degreasing bath with 0.4 μm copper on all sides.

After the water rinse, the copper-plated steel plate is dehydrated in a perchloroethylene vapor bath and dried, rinsed in toluene and immersed, still wet with toluene, in the aluminum plating bath.

For Al-electroplating in aprotic, oxygen- and water-free organoaluminum complex-salt electrolyte media, the cathode rack equipped with bare metal plates is immersed, wet with toluene or xylene, in the toluene-diluted electrolyte via the lock filled with inert gas ($N_2$ or Ar), and the aluminum electroplating is started in the bath which has a temperature of 80° to 100° C., with the cathode and the electrolyte being moved. Depending on the substrate metal and the thickness of the electrodeposited Al-eloxal layer required, 50 μm electroplated Al are deposited homogeneously on all sides (if desired; depositing on one side only also is sufficient). It is very important in circuit boards that, owing to the high micro throwing power of aluminum electroplating electrolytes, the inside walls of the holes also are plated sufficiently well and thick with electroplated aluminum, so that subsequently, proper anodizing is possible. Movement of the cathode and circulation of the electrolyte must bring about a good flow through the hole canals for this purpose. The motion of the electrolyte also determines the applicable cathode current density to ensure a deposition rate of 10 to 20 or more μm per hour. After the desired electroplated Al layer thickness is deposited, the cathode frame with the aluminum-electroplated metal plates are pulled up in the lock, the spray rinse with toluene is performed there in an inert gas, and the occupied cathode rack is removed from the lock. By brief immersion in a pickling bath, for instance, TRINORM "Al"(TM), residual electrolyte and hydrolysis products are dissolved, and after rinsing in flowing water, silverbright, mat and glarefree aluminum electrodeposits are obtained.

The electrodeposited aluminum is now anodized to form the electroplated aluminum eloxal immediately thereafter in a GSX anodizing bath. In the case of metal core substrates of copper, iron and other metals as well as silver material, only a percentage of the grown electroplated Al can be converted into electroplated Al eloxal, while with aluminum and titanium substrate materials, the entire electroplated Al and, if desired, also part of the substrate material, can be anodized into electroplated Al eloxal. The layer (60 μm) is very hard and accordingly, wear resistant, and is subsequently densified in boiling deionized water for 30 to 60 minutes. A particularly high dielectric strength is obtained which, if required, can be increased by an additional but thin insulating varnish film of a polyimide.

(B) Generating The Conductor Track Structure By An Additive Technique

The electrodeposited Al-eloxal surface is provided, by means of the photo resist technique known per se, with the desired conductor run structure. The surface regions which are bare after the non-hardened resist areas are dissolved off (conductor run structures) are coated by means of an electroless copper or nickel bath (chemical copper- or nickel plating) and the metal layers, which are only a few μm thick, are reinforced in electroplating copper baths. To obtain good solderability, the conductor run structures are tinned entirely or partially. Finally, the remaining hardened photo resist film is removed.

EXAMPLE 2

On an electroplated Al-eloxal-coated metal core circuit board prepared in accordance with Example 1A), a conductor run structure is generated by a subtractive technique as follows.

To this end, the electroplated Al eloxal surface is first copper-plated without current. The copper layer, which is only a few μm thick, is subsequently reinforced in an electroplating copper bath to 15–35 μm. By means of the photo resist technique, known per se, the desired conductor run structure is then applied. After exposure, the conductor runs are exposed and the bare copper surfaces are electroplated with tin. Finally, the remaining resist film is stripped off and the exposed copper etched away, so that the tinned conductor runs and soldering pads alone remain on the electroplated Al eloxal surface.

What is claimed is:

1. A heat removing circuit board comprising:
   a flat core plate of a material selected from iron, titanium, conductive carbon and graphite;
   on said core plate a thin first intermediate layer of a material selected from copper and silver;
   a second intermediate layer on and in direct contact with said first intermediate layer, said second intermediate layer being of extremely pure aluminium;
   an outer aluminum eloxal layer on and in direct contact with said second intermediate layer; and
   conductor runs on said outer aluminum eloxal layer, said conductor runs being of a material selected from copper and nickel.

2. The heat removing circuit board of claim 1 wherein said core plate consists of iron.

3. The heat removing circuit board of claim 2 wherein said core plate has a thickness of 1 to 5 mm, said thin first intermediate layer has a thickness of 0.1 to 2 μm, and said second intermediate layer and said aluminum eloxal layer together have a thickness of 10 to 80 μm.

4. The heat removing circuit board of claim 1 wherein said core plate has a thickness of 1 to 5 mm, said thin first intermediate layer has a thickness of 0.1 to 2 μm, and said second intermediate layer and said aluminum eloxal layer together have a thickness of 10 to 80 μm.

5. A heat removing circuit board comprising:
   a flat core plate of copper;
   on said core plate a thin first intermediate layer of silver;
   a second intermediate layer of extremely pure aluminum on and in direct contact with said first intermediate layer;
   an outer aluminum eloxal layer on and in direct contact with said second intermediate layer; and
   conductor runs on said outer aluminum eloxal layer, said conductor runs being of a material selected from copper and nickel.

6. The heat removing circuit board of claim 5 wherein said core plate has a thickness of 1 to 5 mm, said thin first intermediate layer has a thickness of 0.1 to 2 μm, and said second intermediate layer and said aluminum eloxal layer together have a thickness of 10 to 80 μm.

* * * * *